United States Patent [19]

Lang

[11] Patent Number: 4,758,772
[45] Date of Patent: Jul. 19, 1988

[54] DISCHARGE INDICATING MEANS FOR A STORAGE BATTERY

[75] Inventor: Gerhard Lang, Altweilnau, Fed. Rep. of Germany

[73] Assignee: Braun Aktiengesellschaft, Kronberg, Fed. Rep. of Germany

[21] Appl. No.: 64,050

[22] Filed: Jun. 19, 1987

[30] Foreign Application Priority Data

Jul. 9, 1986 [DE] Fed. Rep. of Germany ....... 3622991

[51] Int. Cl.$^4$ .............................................. H02J 7/02
[52] U.S. Cl. .................................... 320/48; 320/13; 340/636
[58] Field of Search ............................ 320/13, 21, 48; 340/636

[56] References Cited

U.S. PATENT DOCUMENTS

| | | | |
|---|---|---|---|
| 3,894,278 | 7/1975 | Gerum | 320/48 |
| 3,939,421 | 2/1976 | Barringer et al. | 320/48 X |
| 4,005,344 | 1/1977 | Gaind et al. | 320/13 X |
| 4,019,112 | 4/1977 | Satoh | 340/636 X |
| 4,211,478 | 7/1980 | Huber et al. | 340/636 X |
| 4,217,536 | 8/1980 | Izumi | 340/636 X |
| 4,567,476 | 1/1986 | Lang | 340/636 |

FOREIGN PATENT DOCUMENTS

| | | |
|---|---|---|
| 2306545 | 8/1974 | Fed. Rep. of Germany . |
| 2420149 | 7/1975 | Fed. Rep. of Germany . |
| 2353345 | 10/1976 | Fed. Rep. of Germany . |
| 2529633 | 1/1977 | Fed. Rep. of Germany . |
| 1955604 | 8/1977 | Fed. Rep. of Germany . |
| 3300284A1 | 7/1984 | Fed. Rep. of Germany . |
| 2558265 | 7/1985 | France . |
| 5590868 | 12/1978 | Japan . |

OTHER PUBLICATIONS

*Elektronik*, "Aufwarts-/Abwarts-Schaltregler", German, 26/27.12.85.

*Primary Examiner*—R. J. Hickey

[57] ABSTRACT

The invention is directed to a discharge indicating means for a storage battery (B) in which a choke (L) and a first transistor (T1) are connected to the storage battery via a switching device (S). The base of a second transistor (T2) arranged between the base of the first transistor (T1) and reference potential is controlled such that the circuit arrangement will start oscillating and an indicating device connected in parallel with the first transistor (T1) will light when the battery voltage (UB) has dropped below a predetermined threshold.

9 Claims, 1 Drawing Sheet

DISCHARGE INDICATING MEANS FOR A STORAGE BATTERY

BACKGROUND OF THE INVENTION

This invention relates to a discharge indicating means for a storage battery, with a choke and a first transistor connected in series with the storage battery, with the base of the first transistor being periodically controlled, with a load energized by the storage battery, and with an indicating device connected in parallel with the collector-emitter circuit of the first transistor.

Circuit arrangements of this type are used if the indicating device requires an operating voltage higher than the battery voltage. If, for example, the source of energy is a single-cell storage battery and the indicating device is a light-emitting diode, the battery voltage has to be raised to about 2 volts. Such arrangements are also referred to as direct-current step-up arrangements or step-up switching controllers.

A step-up switching controller of this type is known, for example, from the "Elektronik" journal, No. 26/85 of Dec. 27, 1985, pp. 57 to 59. In the step-up switching controller illustrated therein, the switching transistor is controlled by means of a switching controller including an oscillator, that is, the switching transistor or the entire arrangement operates under external control.

It is an object of the present invention to provide a discharge indicating means for a storage battery which requires a small number of components and is characterized by high operational safety and ease of handling.

SUMMARY OF THE INVENTION

The solution of the invention affords the added advantage of testing the battery voltage automatically at working load, without the need to provide a battery test key. The user will recognize in time when the battery needs to be recharged to assure continued operation of the appliance. The arrangement being self-oscillating, no external control is necessary. Accordingly, the arrangement is characterized by a simple structure and economy of manufacture. The power consumed by the indicator to signal that the battery needs to be recharged or changed is low. The circuitry will not start oscillating and the indicating device will not respond until the battery voltage has dropped below the predetermined threshold. On account of the hysteresis action of the arrangement, the visual indicating device will not flicker when the voltage is in the vicinity of the predetermined threshold.

Advantageous embodiments of the invention will become apparent from the following description of two embodiments.

DESCRIPTION OF PARTICULAR EMBODIMENTS

Figure 1:
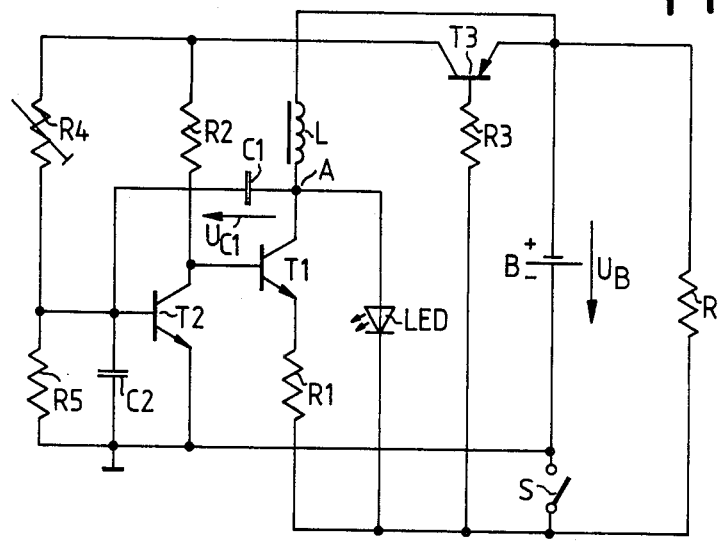
FIG. 1 shows a simple embodiment of the discharge indicating means of the invention.

In FIG. 1, the source of energy is, for example, a single-cell storage battery supplying a voltage UB. In this embodiment, the negative pole of the storage battery B represents reference potential. Via an on-off switching device S, a load which in this embodiment is represented by resistor R is connected to the circuit. At the same time, with switching device S closed, a choke L, a first transistor T1 which is the switching transistor, and an emitter resistor R1 connected in series with the storage battery B and the switching device S are connected to the battery voltage. A light-emitting diode LED is connected in parallel with the transistor T1 and the emitter resistor R1. The junction of the choke L, the transistor T1 and the anode of the light-emitting diode LED is identified by A. Connected to the positive pole of the storage battery B is the emitter-collector circuit of a third transistor T3 in series with a resistor R2 and a second transistor T2 is connected to the negative pole of the battery B. Connected in parallel with resistor R2 and transistor T2 is a voltage divider R4/R5 having the base of transistor T2 connected to its junction. The base of transistor T3 is connected via a resistor R3 to the end of switching device S remote from the battery.

This circuit configuration has the advantage that not until actuation of the on-off switching device S which connects the load to the battery is the arrangement put into operation, and that the battery voltage is sensed directly at the poles of the battery, so that the contact resistance of the switching device S cannot corrupt the sensed data. The voltage divider comprised of resistors R4, R5 is adjusted such that transistor T2 is not turned off until the battery voltage UB has dropped below a predetermined value which, for example, may be 20% lower than the rated voltage. This desired response threshold from which light-emitting diode LED is to light is adjusted by means of resistor R4.

The mode of operation of this arrangement shall be explained in the following.

Assuming first that switching device S is open, that is, no voltage is applied to the circuit arrangement and the load R, and choke L and capacitor C1 are discharged. If switching device S is subsequently closed, that is, the battery B or the battery voltage UB is applied to the load R, the circuit comprised of the choke L, the transistor T1, the emitter resistor R1 and the light-emitting diode LED is at the same time connected to the battery B, and the other components of the circuitry (resistor R2, transistor T2, voltage divider R4/R5) are activated by transistor T3 which is meanwhile conducting. The battery voltage UB is sensed by the voltage divider R4/R5 directly at working load, that is, without being affected by the potentially changing contact resistance of switching device S. If the battery voltage UB is above the threshold adjusted by means of R4, transistor T2 is conducting while transistor T1 remains nonconducting. The light-emitting diode LED does not light since its breakdown voltage is higher than the battery voltage UB put across choke L.

If the battery voltage UB drops below the set threshold which, for example, may be 20% lower than the rated voltage of the battery, transistor T2 begins to enter its nonconductive state and transistor T1, controlled via resistor R2, is rendered conductive. Capacitor C1 receives a positive precharge on the left electrode through resistor R4 and the collector-emitter circuit of transistor T1.

Via conducting transistor T1, a linearly rising current beings to flow through the choke L, causing the voltage dropping along emitter resistor R1 to rise. As a result, a voltage is applied to the right electrode of capacitor C1 which is more positive than on the left electrode, and the ensuing reverse charging current will raise the base potential of transistor T2, bringing T2 into conduction and causing transistor T1 to be cut off. The induced voltage built up in choke L which is in opposition to the voltage applied shortly before is additive to the battery voltage UB. The moment transistor T1 is turned off, the voltage at junction A will increase to value UDF, UDF being the forward voltage of light-emitting diode LED.

As a result of the voltage increase at junction A, the voltage UC1 at capacitor C1 will increase again, the charging current causing transistor T2 to remain fully conducting and transistor T1 to remain cut off completely. The current flowing through light-emitting diode LED decreases as a result of the drop in the induced voltage of choke L, and the voltage UC1 at capacitor C1 will fall, causing the effect of the charging current of capacitor C1 upon the base of transistor T2 to be reduced. The base-emitter circuit of transistor T2 is then again determined by the voltage divider R4/R5, and transistor T2 beings to enter its nonconducting state on account of the suitably adjusted threshold. This causes transistor T1 to go into conduction again, and the cyclic process is repeated as described above. This means that the arrangement starts oscillating causing the light-emitting diode LED to light as soon as the battery voltage UB drops below the predetermined value with the load R switched on.

Accordingly, the arrangement is self-oscillating, obviating the provision of components for an external control of the base of transistor T1. The oscillating frequency is governed by the load of the light-emitting diode LED and by the dimensioning of the choke L and the capacitor C1. In a practical embodiment incorporating a single-cell storage battery B and a light-emitting diode LED having a breakdown voltage of 2 volts, the oscillating frequency is 280 kHz, approximately.

Capacitor C2 which is connected in parallel with the base-emitter circuit of transistor T2 prolongs the off phase of transistor T2 and thus the magnetization period of choke L, causing the induced voltage of choke L to rise and the light-emitting diode LED to light with increased brightness.

Figure 2:
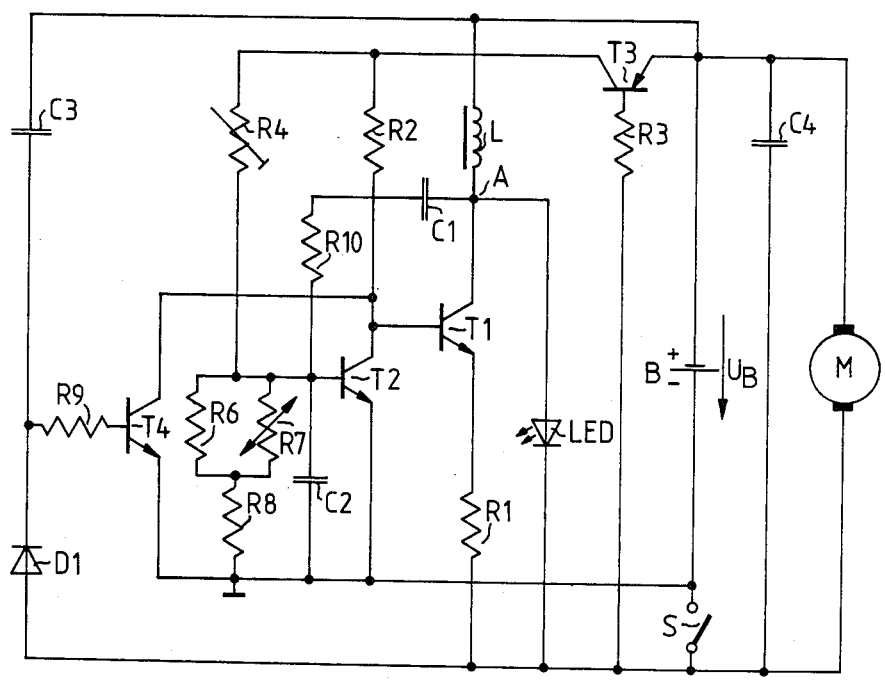
FIG. 2 shows an embodiment incorporating further advantageous configurations for an inductive load, for example, a direct-current motor.

The mode of operation of the circuit configuration shown in FIG. 2 is identical to the one of FIG. 1. Like components are identified by like reference characters. In the configuration of FIG. 2, the load is a direct-current motor M having a smoothing capacitor C4 connected in parallel.

In this Figure, the lower voltage divider resistor (R5 in FIG. 1) is comprised of resistors R6, R7 connected in parallel and resistor R8 connected in series therewith, with resistor R7 being configured as an NTC resistor (resistor with negative temperature coefficient). This resistor configuration provides for adaptation to the temperature variation of the battery, it being understood that the type of load is irrelevant for this particular configuration.

Resistor R10 which in FIG. 2 is added in series with capacitor C1 serves to attenuate any interference voltage peaks, in particular those originating from the motor M.

The further added circuitry provided in FIG. 2 (transistor T4, resistor R9, capacitor C3, diode D1) serves to improve the mode of operation of the arrangement as it is turned on and off with a direct-current motor M used as the load, that is, a load with an inductive behavior. In this arrangement, the collector-emitter circuit of a transistor T4 is connected in parallel with the collector-emitter circuit of transistor T2. Connected to the motor M are a capacitor C3 and a diode D1 in series arrangement. The junction of capacitor C3 and the cathode of diode D1 is connected to the base of transistor T4 through a resistor R9.

As switching device S is closed, the starting current of motor M makes an increased demand on the battery B, the battery voltage UB dropping temporarily below the set response threshold which would cause the light-emitting diode LED to light even with the battery still sufficiently charged. Closing of the switching device activates transistor T4 immediately through capacitor C3 and resistor R9 which constitute a timing element, whereby reference potential is applied to the base of transistor T1 preventing the circuit arrangement from starting to oscillate. Capacitor C3 is discharged through resistor R9 and the conducting base-emitter circuit of transistor T4. The time constant C3, R9 determines the duration of the conducting phase of transistor T4, that is, the period of time following closing of the switching device during which the arrangement remains at rest.

When the motor is turned off, it does not come to a standstill immediately but continues running for some time, acting as a generator energizing the circuitry temporarily which would likewise cause the light-emitting diode LED to light. This is prevented by transistor T4 going temporarily into conduction as switching device S is opened, causing reference potential to be temporarily applied to the base of transistor T1 as a result of which an oscillation of the circuitry is avoided.

I claim:

1. A discharge indicating means for a storage battery that has first and second terminals, said circuit comprising
   a choke, a first transistor that has a base and a collector-emitter circuit, first means for connecting said choke and said first transistor in series with said storage battery,
   means for connecting a load to be energized to said storage battery,
   an indicating device, second circut means connecting said indicating device in parallel with the collector-emitter circuit of said first transistor,
   a second transistor that has a base and a collector emitter circuit, third circuit means connecting the connector-emitter circuit of said second transistor in circuit between the base of the first transistor and the first terminal of said battery,
   a first capacitor, fourth circuit means connecting said first capacitor in circuit between said choke and the base of said second transistor,
   a switching device, fifth circuit means connecting said switching device in circuit between the first terminal of said storage battery and said first circuits means connecting said choke and said first transistor in series with said storage battery, said switching device being arranged to establish current flow through said load and said choke,
   a third transistor that has a base and a collector-emitter circuit, and sixth circuit means connecting said third transistor in circuit between said second terminal of said battery said second transistor for applying a signal to said second transistor when the voltage of said battery falls below a predetermined value to cause oscillating operation of said first transistor and energization of siad indicating device.

2. The discharge indicating means of claim 1 and further including a voltage divider circuit connected in parallel with said storage battery, and seventh circuit means connecting said first capacitor in circuit between the base of said second transistor and the junction between said choke and said first transistor.

3. The discharge indicating means of claim 1 and further including a second capacitor connected in parallel with the base-emitter circuit of said second transistor.

4. The discharge indicating means of claim 1 and further including a second resistor connected in series with said first capacitor.

5. A discharge indicating means as claimed in any one of claims 1-3 and further including a resistance network connected to the base of said second transistor, said resistance network including two resistors in parallel and a third resistor connected in series therewith, one of said parallelled resistors being an NTC resistor for providing compensation for temperature variation of the storage battery.

6. A discharge indicating means as claimed in any one of claims 1-3 wherein said load is an inductive load, and further including a third capacitor and a diode connected in series and defining a junction therebetween, a fourth transistor connected in parallel with the collector-emitter circuit of said second transistor, said fourth transistor having a base and a collector-emitter circuit, and a fourth resistor connected between the base of said fourth transistor and said junction between said third capacitor and said diode.

7. A discharge indicating means as claimed in any one of claims 1-3 wherein said indicating means is a light emitting diode.

8. A discharge indicating means as claimed in claim 1 wherein said load is inductive, and further including a time delay circuit connected to said first transistor for delaying said oscillating operation of said first transistor in response to initial establishment of current flow through said load by said switching device.

9. A discharge indicating means as claimed in claim 8 wherein said indicating means is a light emitting diode.

* * * * *